United States Patent
Doering et al.

(10) Patent No.: US 7,601,969 B2
(45) Date of Patent: Oct. 13, 2009

(54) ILLUMINATION CONDENSER FOR A PARTICLE OPTICAL PROJECTION SYSTEM

(75) Inventors: Hans-Joachim Doering, Jena (DE); Thomas Elster, Jena (DE)

(73) Assignee: Vistec Electron Beam GmbH, Jena (DE)

(*) Notice: Subject to any disclaimer, the term of this patent is extended or adjusted under 35 U.S.C. 154(b) by 233 days.

(21) Appl. No.: 11/587,227

(22) PCT Filed: Mar. 3, 2005

(86) PCT No.: PCT/EP2005/050941

§ 371 (c)(1), (2), (4) Date: Oct. 23, 2006

(87) PCT Pub. No.: WO2005/104170

PCT Pub. Date: Nov. 3, 2005

(65) Prior Publication Data

US 2008/0035853 A1    Feb. 14, 2008

(30) Foreign Application Priority Data

Apr. 23, 2004  (DE) ................. 10 2004 019 835

(51) Int. Cl.
  *H01J 37/141* (2006.01)
(52) U.S. Cl. .................. 250/396 ML; 250/396 R
(58) Field of Classification Search .......... 250/396 ML, 250/492.1, 492.2, 492.22; 313/359.1, 437, 313/442; 315/382
  See application file for complete search history.

(56) References Cited

U.S. PATENT DOCUMENTS

| | | | |
|---|---|---|---|
| 3,560,781 A * | 2/1971 | Riecke | 313/359.1 |
| 3,686,527 A * | 8/1972 | Gabor | 315/382 |
| 4,468,563 A | 8/1984 | Tsuno et al. | |
| 4,544,847 A * | 10/1985 | Taylor | 250/396 ML |
| 5,742,062 A | 4/1998 | Stengl et al. | |
| 6,064,071 A * | 5/2000 | Nakasuji | 250/492.23 |
| 6,222,197 B1 * | 4/2001 | Kojima | 250/492.22 |
| 6,420,713 B1 * | 7/2002 | Stickel et al. | 250/396 ML |
| 6,566,664 B2 * | 5/2003 | Muraki | 250/492.2 |
| 6,642,525 B2 * | 11/2003 | Kienzle et al. | 250/396 ML |
| 6,727,507 B2 * | 4/2004 | Shimazu et al. | 250/492.1 |

FOREIGN PATENT DOCUMENTS

| | | |
|---|---|---|
| DE | 1 564 761 | 3/1970 |
| DE | 32 24 871 | 10/1984 |
| DE | 197 34 059 | 2/1998 |

OTHER PUBLICATIONS

Optik 100 (1995), pp. 179-187 "Procedures For Minimizing The Aberrations Of Electromagnetic Compound Lenses" D. Preikszas, H. Rose.

* cited by examiner

*Primary Examiner*—Nikita Wells
*Assistant Examiner*—Johnnie L Smith
(74) *Attorney, Agent, or Firm*—Reed Smith LLP

(57) ABSTRACT

An illumination condenser for a particle optics projection system is disclosed. The illumination condenser is formed of a magnetic lens comprising a plurality of gaps. The magnetic lens is formed of a sequence of a plurality of partial lenses.

12 Claims, 3 Drawing Sheets

ILLUMINATION CONDENSER FOR A PARTICLE OPTICAL PROJECTION SYSTEM

CROSS-REFERENCE TO RELATED APPLICATIONS

This application claims priority of International Application No. PCT/EP2005/050941, filed Mar. 3, 2005 and German Application No. 10 2004 019 835.7, filed Apr. 23, 2004, the complete disclosures of which are hereby incorporated by reference.

BACKGROUND OF THE INVENTION a) Field of the Invention

The invention is directed to an illumination condenser for a particle optics projection system.

b) Description of the Related Art

In semiconductor fabrication, it is often necessary to illuminate an object (mask or multi-beam modulator) telecentrically by means of a condenser. In so doing, the partial crossover belonging to an off-axis point of the mask is usually directed away from the axis due to the spherical aberration of the condenser, which results in additional errors (inclined beam incidence in target, astigmatism and/or distortion). The off-axis crossover causes additional aberrations in the particle optics projection device because the beams pass the lens fields at a greater distance from the axis. It is essentially the spherical aberration of the illumination condenser that causes the partial crossover to be off-axis. The effect of the spherical aberration of the illumination condenser is proportional to the third power of the operative aperture in the crossover. In large-field particle optics projection systems, this aperture is very large, typically 100 mrad. It can be reduced in existing illumination condensers only by a very large distance between the particle source and the mask or multi-aperture multi-beam modulator. However, this results in an excessive structural height of the particle beam projection system.

U.S. Pat. No. 5,742,062 describes an electrostatic lens which comprises a plurality of annular electrodes to which different potentials are applied. This lens is suited to enable a large-field parallel illumination of an object (mask) with charged particles. It is possible to minimize lens aberrations through suitable selection of the electrode potentials. It is disadvantageous that elaborate technical resources are required to provide a plurality of different potentials in a highly consistent manner over time. In case of high beam energy (50 . . . 200 keV), long insulation distances are required, the vacuum feedthroughs are correspondingly large, and therefore the required vacuum volumes for this arrangement are also large. This leads to the disadvantage that the shielding of the particle beam from magnetic interference fields is very extensive because suitable shielding cylinders, e.g., made of Mu metal, require a large radius and thick walls. Further, the outgassing of the large surface of the electrodes and insulators is disadvantageous for the desired low final pressure in the chamber and for a suitably low contamination rate.

Rose's paper on the magnetic-electrostatic multielectrode lens (D. Preikszas, H. Rose, Optik 100 (1995), 179) discloses a combined magnetic-electrostatic lens comprising a quantity of identical elements (apertures, ring currents) which are controlled in such a way that aberrations are suppressed to a great extent.

The prior art is characterized in that the spherical aberration of the illumination condenser in particle beam projection devices is reduced, if at all, only over the large radial extension of the condenser. This substantially limits the possible size of the mask and/or of the multi-aperture beam modulator. There have only been attempts with electrostatic condenser lenses having very many electrodes (multi-aperture condenser) to achieve a shape of the electrostatic field of the condenser such that the spherical aberration is extensively suppressed. However, an electrostatic multi-aperture condenser of this kind requires a large quantity of high-voltage supplies for the individual electrodes and is therefore only usable to a limited extent.

OBJECT AND SUMMARY OF THE INVENTION

It is the primary object of the invention to develop a projection device for exposing substrates such that a mask or a multi-aperture beam modulator is illuminated preferably in a telecentric manner. Further, the structural height of the projection device should be kept within reasonable limits.

It is advantageous when the illumination condenser for a particle optics projection system is formed of a magnetic lens and when the magnetic lens comprises a plurality of gaps. The quantity of gaps is greater than or equal to five. The magnetic lens comprises a sequence of a plurality of partial lenses. Each of the plurality of partial lenses comprises a separate winding, each winding being controllable individually. At least two adjacent partial lenses have a common pole piece.

Further, it is advantageous when the illumination condenser is constructed in such a way that the aberration of the source crossover is minimized, wherein the radial extension, the maximum bore hole radius $R_k$ of the illumination condenser, is less than 150 mm.

Further, it can be advantageous that an illumination condenser of this kind is combined with an electrostatic diverging lens which further minimizes aberrations.

Further, it can be advantageous that an illumination condenser of this kind is constructed as a multiple-gap doublet (two multiple-gap lenses one behind the other with opposed image rotation). In this case, anisotropic residual errors would be compensated.

This object is met by a system for a particle optics projection system comprising an illumination condenser which is formed of a magnetic lens and a magnetic lens comprising a plurality of gaps.

It is particularly advantageous when the illumination of the mask is carried out in such a way that the partial crossover of a point on the mask or multi-aperture beam modulator remains on the optical axis of the particle beam projection device as far as possible.

The subject matter of the invention is shown schematically in the drawings and is described in the following with reference to the figures.

DESCRIPTION OF THE PREFERRED EMBODIMENTS

Figure 1:
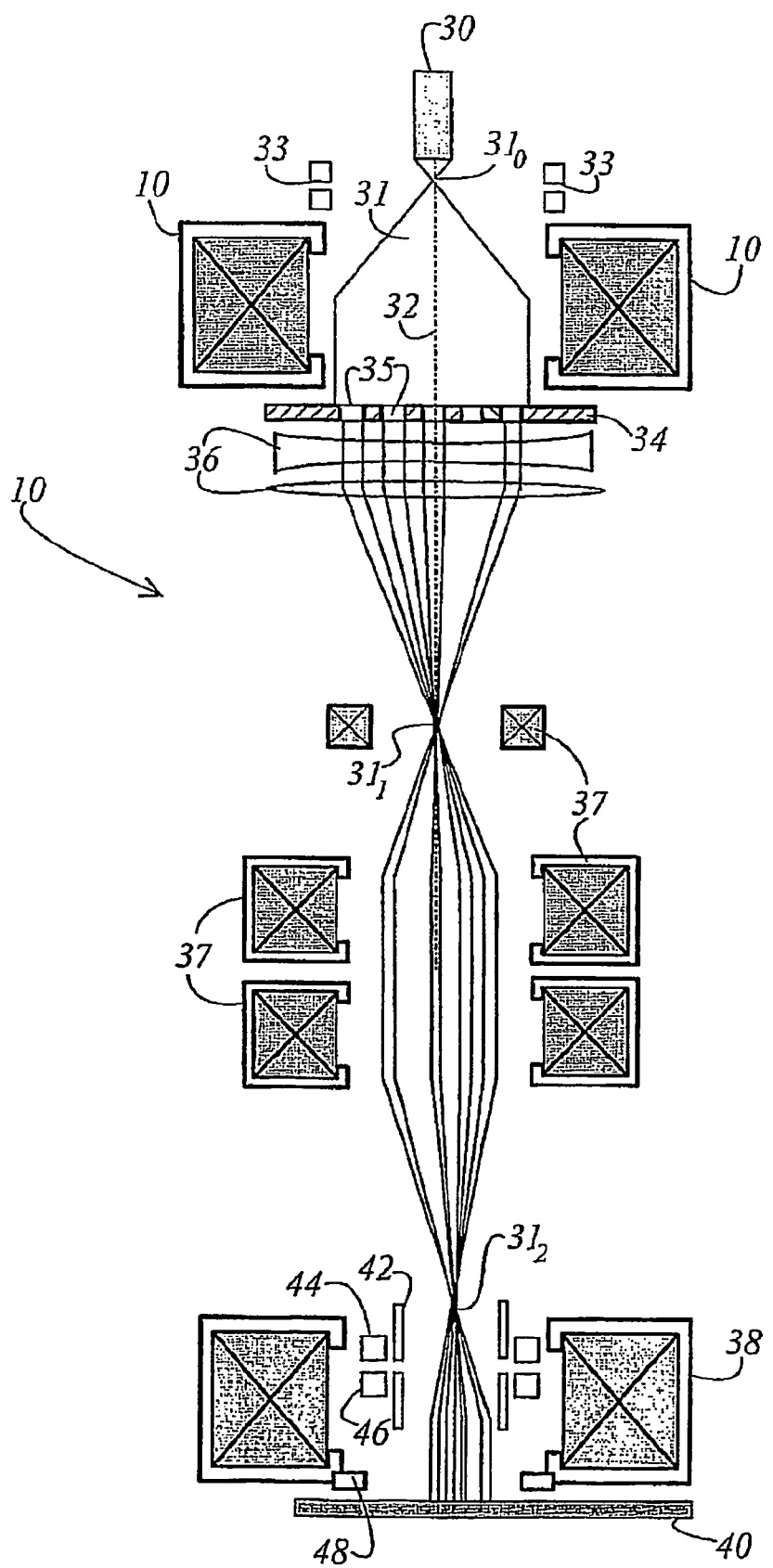
FIG. 1 is a schematic view of the beam path in a particle optics projection system.

FIG. 1 shows the basic beam path in a particle optics projection system 2. The following description is directed to the particle optics projection system 2, wherein the particles are electrons. An electron beam 31 is generated by an electron gun (particle gun) 30 and propagates in direction of an electron-optical axis 32. The electrons exiting from the electron cannon 30 have a source crossover $31_0$. A beam centering device 33 which orients the electron beam 31 symmetrically around the optical axis 32 is arranged downstream of the electron cannon 30. After the beam centering device, the electron beam 31 traverses an illumination condenser 10 which forms a parallel beam from the initially divergent electron beam 31. The beam formed by the illumination condenser 10 has a diameter over which the intensity is homogeneously distributed. An aperture 34 with a plurality of openings 35 for the electron beam is provided downstream of the illumination condenser 10. After the deflecting plate 34 there follows an acceleration lens 36 followed by at least one magnetic lens 50 for beam rotation. Two additional magnetic lenses 37 which serve to reduce the imaging of the aperture plate 34 are shown in the present embodiment example. Before the electron beam 31 strikes the target 40, e.g., a wafer, the electron beam 31 passes through an objective lens 38. The objective lens 38 is outfitted with a plurality of elements. A deflecting device 42 is provided before and after a second crossover $31_2$ of the electron beam 31. The deflecting device 42 serves for deflecting and for determining the position of the electron beam 31 or the plurality of individual beams generated through the aperture plate 34. Further, a focusing lens 44 is provided for dynamic focusing, and a coil arrangement 46 is provided as a stigmator. Across from the target 40, the objective lens 38 has a height sensor 48 and a detector for the electrons which are backscattered by the target 40.

Figure 2:
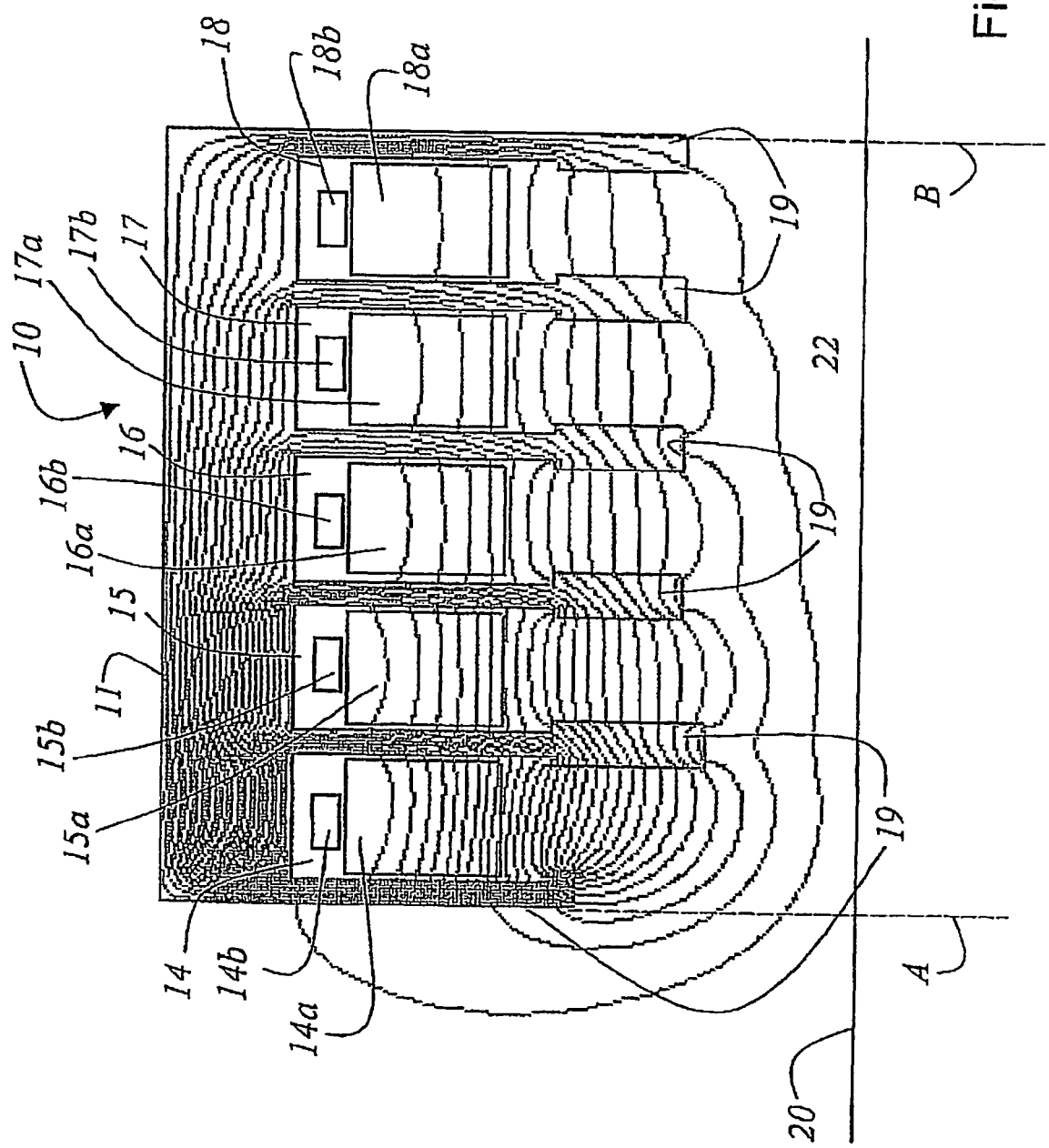
FIG. 2 shows an embodiment example of a magnetic illumination condenser according to the invention.

FIG. 2 shows an embodiment form of an illumination condenser 10 according to the invention. The illumination condenser 10 comprises a magnetic lens 11 formed of a plurality of gaps 12. A gap number ny>=5 is preferred. The illumination condenser 10 presents a magnetic lens with a long focal length. The focal length is typically around 500 mm. The particle beam exiting from the illumination condenser 10 illuminates a mask or a multi-aperture beam modulator or an aperture plate 40, preferably telecentrically. For this purpose, the source crossover $31_0$ must lie in the object-side focal point of the illumination condenser 10, i.e., the source crossover $31_0$ is imaged at infinity.

In the embodiment example of a magnetic illumination condenser 10 according to the invention shown in FIG. 2, the magnetic lens 11 comprises five gaps. The illumination condenser 10 consequently comprises a sequence of a plurality of parallel lenses 14, 15, 16, 17 and 18 which are arranged in the beam path 20 of the particle optics projection device 2 in front of the mask or an aperture plate 40 and illuminate the latter preferably telecentrically. Each partial lens 14, 15, 16, 17, 18 has a first winding 14a, 15a, 16a, 17a, 18a with separately adjustable excitation. The adjustment of the separate excitations of the partial lenses can also be carried out by means of an individual number of turns for the first windings 14a, 15a, 16a, 17a, 18a. The windings which are operated in series can then be supplied from a common power source. Further, it may be advantageous to provide second windings (fine windings) 14b, 15b, 16b, 17b, 18b in addition to the first windings (coarse windings) 14a, 15a, 16a, 17a, 18a. The second windings (fine windings) 14b, 15b, 16b, 17b, 18b preferably have individual numbers of turns for each partial lens 14, 15, 16, 17, 18. By varying the excitation of the series-connected fine windings, a sensitive focal length variation can be carried out in a simple manner when the series connection of the coarse windings is carried out from a shared constant-current source at the same time. Two adjacent partial lenses share a common pole piece 19. The excitations and gaps of the partial lenses 14, 15, 16, 17, 18 and the diameter of the pole piece 19 differ from one another.

In the embodiment example with five gaps shown in FIG. 2, a total of sixteen parameters can be selected individually in such a way that the spherical aberration of the illumination condenser 10 in the imaging of the source crossover $31_0$ is minimized, provided that the radial extension, the maximum bore hole radius $R_k$ of the illumination condenser 10, does not exceed a certain size. A typical size for the bore hole radius $R_k$ of the illumination condenser 10 is less than 150 mm.

Only one half of the illumination condenser 10 is shown in FIG. 2. The illumination condenser 10 is rotationally symmetric around an axis 21 of the beam path 20. The beam path 20 passes through the illumination condenser 10 from a beam entrance A to a beam exit B. In the illumination condenser 10 of the present invention, the magnetic flux lines 22 develop in such a way that they recede farther from the axis 21 of the beam path 20 as point B of the illumination condenser 10 is approached. In other words, the magnetic field strength 24 represented by the magnetic flux lines 22 is smaller at the beam exit A of the illumination condenser 10 than at the beam entrance B.

Figure 3:
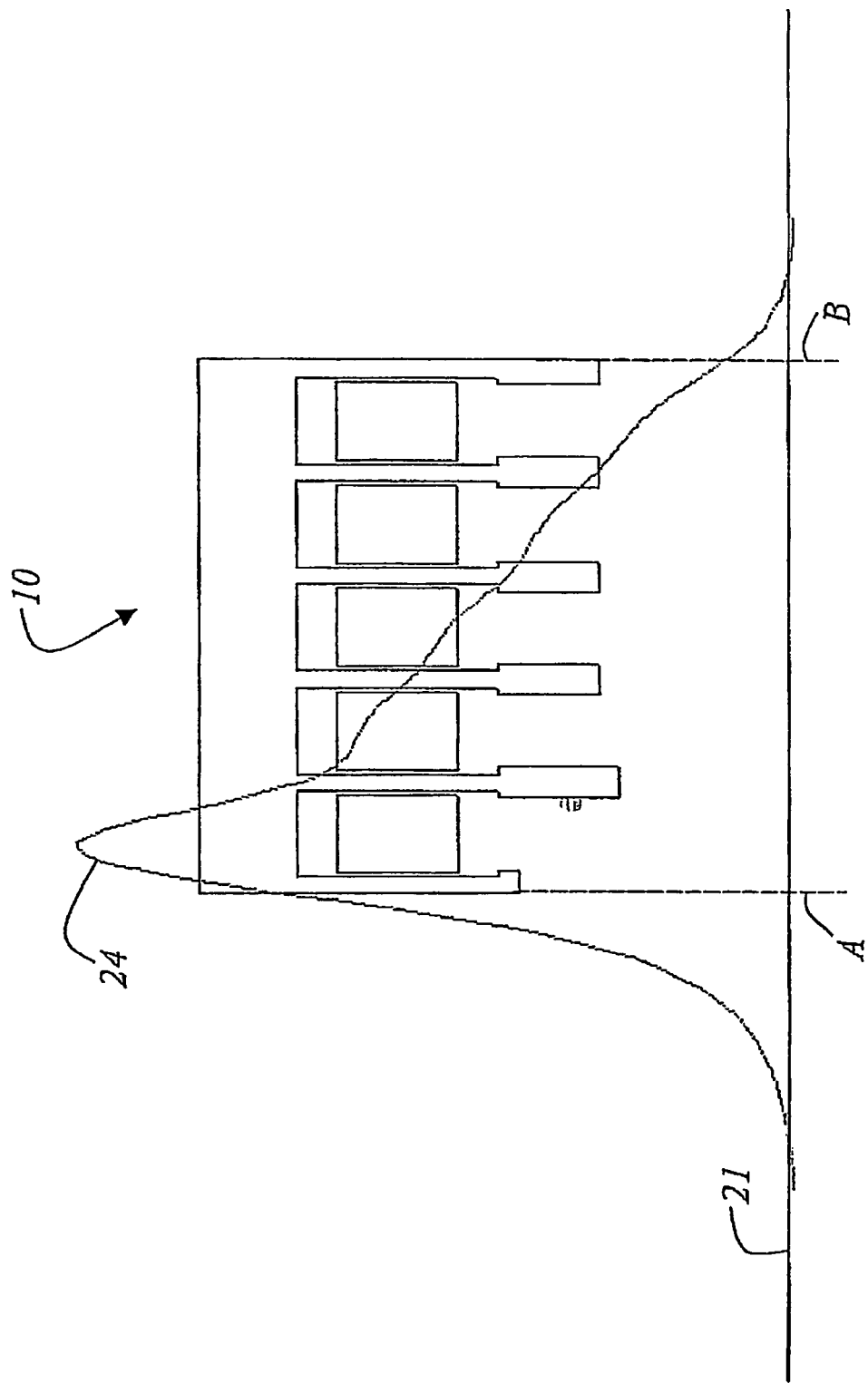
FIG. 3 shows the axial field distribution of the magnetic illumination condenser.

FIG. 3 shows the curve of the axial field distribution of an optimized illumination condenser 10. Since the source crossover $31_0$ is preferably imaged at infinity, the illumination condenser 10 is optimized in such a way that the quotient of the circle of confusion of the crossover and the diameter of the crossover is minimal when the crossover approaches infinity in the limiting case. The magnetic field strength 24 of the illumination condenser 10 according to the invention is shown as a function of the position with reference to the axis 21 of the beam path. It can be seen that the magnetic field strength 24 in the area of point A increases sharply and reaches a maximum at a short distance. Proceeding from the maximum, the magnetic field strength 24 then steadily decreases and reaches zero approximately at point B.

The invention has been described with reference to a particular embodiment example, but it will be self-evident for the person skilled in the art that changes and modifications may be carried out within the framework of the technical expertise of the person skilled in the art without departing from the protective scope of the appended patent claims.

The invention claimed is:

1. An illumination condenser for a particle optics projection system comprising:
   a magnetic lens having a plurality of gaps; and
   said magnetic lens comprising a sequence of partial lenses;
   wherein each of said partial lenses has separate windings that are individually controlled such that the magnetic field strength decreases along said sequence of partial lenses and reaches approximately the value of zero at a beam exit of the illumination condenser.

2. The illumination condenser according to claim 1, wherein the quantity of said partial lenses is greater than five.

3. The illumination condenser according to claim 1, wherein the quantity of said partial lenses is five.

4. The illumination condenser according to claim 1, wherein each of the plurality of partial lenses comprises first separate windings and second separate windings, wherein the turns ratio of the first windings and of the second windings is selected in such a way that the partial lenses obtain the desired excitation when the first windings are operated in a series connection and the second windings are operated in a series connection.

5. The illumination condenser according to claim 4, wherein a constant current flows through the first windings (coarse windings) of the partial lenses, and a variable current flows through the second windings (fine windings) of the partial lenses.

6. The illumination condenser according to claim 1, wherein at least two adjacent partial lenses share a common pole piece.

7. The illumination condenser according to claim 1, wherein the particle optics projection system defines an optical axis around which the illumination condenser is constructed so as to be rotationally symmetric.

8. The illumination condenser according to claim 7, said illumination condenser having a maximum bore hole radius Rk of less than 150 mm in order to minimize the aberration of a source crossover.

9. The illumination condenser according to claim 1, wherein the source crossover of an electron gun is arranged in the object-side focal point of the illumination condenser so that the source crossover is imaged at infinity.

10. The illumination condenser according to claim 1, wherein the illumination condenser is a lens with a long focal length of around 500 mm.

11. The illumination condenser according to claim 1, wherein the illumination condenser is combined with an electrostatic diverging lens.

12. The illumination condenser according to claim 1, wherein the illumination condenser comprises a doublet of two partial-lens sequences.

* * * * *